(12) United States Patent
Savariar-Hauck et al.

(10) Patent No.: US 8,530,141 B2
(45) Date of Patent: Sep. 10, 2013

(54) LITHOGRAPHIC PRINTING PLATE PRECURSORS

(71) Applicants: Celin Savariar-Hauck, Badenhausen (DE); Gerhard Hauck, Badenhausen (DE)

(72) Inventors: Celin Savariar-Hauck, Badenhausen (DE); Gerhard Hauck, Badenhausen (DE)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 13/711,648

(22) Filed: Dec. 12, 2012

(65) Prior Publication Data

US 2013/0101939 A1    Apr. 25, 2013

Related U.S. Application Data

(63) Continuation-in-part of application No. 12/606,378, filed on Oct. 27, 2009, now abandoned, and a continuation-in-part of application No. 13/602,367, filed on Sep. 4, 2012.

(51) Int. Cl.
*B41M 5/00* (2006.01)
*G03F 7/00* (2006.01)
*G03F 7/26* (2006.01)

(52) U.S. Cl.
USPC .............. 430/281.1; 430/302; 430/283.1; 101/453; 101/463.1

(58) Field of Classification Search
None
See application file for complete search history.

(56) References Cited

U.S. PATENT DOCUMENTS

| | | |
|---|---|---|
| 5,747,216 A | 5/1998 | Watanabe et al. |
| 7,049,045 B2 | 5/2006 | Kitson et al. |
| 7,144,661 B1 | 12/2006 | Ray et al. |
| 7,186,482 B2 | 3/2007 | Kitson et al. |
| 7,247,418 B2 | 7/2007 | Saraiya et al. |
| 8,034,538 B2 | 10/2011 | Strehmel et al. |
| 2002/0172874 A1 | 11/2002 | Horne et al. |
| 2003/0091932 A1 | 5/2003 | Loccufier et al. |
| 2004/0048195 A1 | 3/2004 | Deroover et al. |
| 2009/0042135 A1 | 2/2009 | Patel et al. |
| 2009/0142695 A1 | 6/2009 | Baumann et al. |
| 2009/0291395 A1 | 11/2009 | Savariar-Hauck et al. |
| 2012/0219915 A1 | 8/2012 | Figov et al. |

*Primary Examiner* — Chanceity Robinson
(74) *Attorney, Agent, or Firm* — J. Lanny Tucker

(57) ABSTRACT

Lithographic printing plate precursors can have an imageable layer that includes a polymeric binder having an acid number of at least 30 mg KOH/g of polymer to and including 150 mg KOH/g of polymer, at least 3 weight % of recurring units derived from one or more N-alkoxymethyl (alkyl)acrylamides or alkoxymethyl (alkyl)acrylates, at least 2 weight % of recurring units having pendant 1H-tetrazole groups, and at least 10 weight % of recurring units having pendant cyano groups. The use of such polymeric binders provides good bakeability and chemical solvent resistance, especially for positive-working precursors.

19 Claims, No Drawings

LITHOGRAPHIC PRINTING PLATE PRECURSORS

RELATED APPLICATIONS

This is a Continuation-in-part of copending and commonly assigned U.S. Ser. No. 12/606,378, filed Oct. 27, 2009 by Celin Savariar-Hauck and Gerhard Hauck, which was recently allowed.

This is also a Continuation-in-part of copending and commonly assigned U.S. Ser. No. 13/602,367, filed Sep. 4, 2012 by Gerhard Hauck, Dietmar Frank, and Celin Savariar-Hauck.

FIELD OF THE INVENTION

This invention relates to imageable elements such as lithographic printing plate precursors that contain a specific polymeric binder to improve print run length. This invention also relates to a method of providing imaged and processed elements such as lithographic printing plates.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged using lasers or laser diodes, and more particularly, that can be imaged or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Imaged elements are often baked after development to increase their on-press run length. U.S. Patent Application Publication 2009/0042135 (Patel et al.) describes positive-working multilayer imageable elements that contain specific polymers having acidic groups dispersed within the inner layer to improve post-development bakeability and chemical solvent resistance. Other imageable elements with improved resistance to press chemicals and bakeability are described for example in U.S. Pat. No. 7,049,045 (Kitson et al.), U.S. Pat. No. 7,144,661 (Ray et al.), U.S. Pat. No. 7,186,482 (Kitson et al.), and U.S. Pat. No. 7,247,418 (Saraiya et al.).

U.S. Patent Application Publication 2009/0142695 (Baumann et al.) describes imageable elements that contain non-polymeric or polymeric components having 1H-tetrazole groups that provide improved chemical resistance and on-press printing run length.

While known imageable elements demonstrate excellent imaging and printing properties, there is a need to further improve the post-development bakeability or to reduce baking temperature and time while maintaining other desired properties including resistance to press chemicals. It is also desirable to reduce the baking temperature and time while maintaining on-press run length.

SUMMARY OF THE INVENTION

This invention provides a lithographic printing plate precursor comprising a substrate and having an imageable layer disposed thereon, the imageable layer comprising an infrared radiation absorbing compound and a polymeric binder having an acid number of at least 30 mg KOH/g of polymer to and including 150 mg KOH/g of polymer, the polymeric binder comprising at least 3 weight % of recurring units derived from one or more N-alkoxymethyl (alkyl)acrylamides or alkoxymethyl alkyl)acrylates, at least 2 weight % of recurring units having pendant 1H-tetrazole groups, and at least 10 weight % of recurring units having pendant cyano groups.

In many embodiments, the polymeric binder is represented by the following Structure (I):

$$\text{-(A)}_w\text{-(B)}_x\text{-(C)}_y\text{-(D)}_z\text{-} \quad (I)$$

wherein A represents recurring units derived from one or more N-alkoxymethyl (alkyl)acrylamides or alkoxymethyl (alkyl)acrylates, B represents recurring units having pendant cyano groups, C represents recurring units having pendant 1H-tetrazole groups, and D represents one or more different recurring units other than those for A, B, and C, and w is from at least 2 weight % to and including 80 weight %, x is at least 10 weight % to and including 85 weight %, y is at least 5 weight % to and including 80 weight %, and z is at least 10 weight % to and including 85 weight %, all based on total polymeric binder weight.

This invention also provides a method comprising:
A) imagewise exposing the printing plate precursor of this invention to produce exposed and non-exposed regions, and
B) with or without a post-exposure preheat step, developing the imagewise exposed printing plate precursor to provide a lithographic printing plate.

Further, this invention provides a novel copolymer that is represented by the following Structure (I):

$$\text{-(A)}_w\text{-(B)}_x\text{-(C)}_y\text{-(D)}_z\text{-} \quad (I)$$

wherein A represents recurring units derived from one or more N-alkoxymethyl (alkyl)acrylamides or alkoxymethyl (alkyl)acrylates, B represents recurring units having pendant cyano groups, C represents recurring units having pendant 1H-tetrazole groups, and D represents one or more different recurring units other than those for A, B, and C, and w is at least 2 weight % to and including 80 weight %, x is at least 10 weight % to and including 85 weight %, y is at least 5 weight % to and including 80 weight %, and z is at least 10 weight % to and including 85 weight %, all based on total polymeric binder weight.

The present invention provides novel copolymers and these copolymers can be used in imageable elements such as lithographic printing plate precursors to provide improved post-development bakeability and solvent resistance. These polymeric binders include certain amounts of recurring units derived from one or more N-alkoxymethyl (alkyl)acrylamides or alkoxymethyl (alkyl)acrylates, recurring units having pendant 1H-tetrazole groups, and recurring units having pendant cyano groups. The combination of recurring units provides properties that are not achieved by either type of recurring unit alone. While some of the individual recurring units might provide either solvent resistance or bakeability, it was unexpected because of the unpredictability of using various recurring units together, that both excellent solvent resistance and bakeability could be achieved with the same copolymer.

DETAILED DESCRIPTION OF THE INVENTION

Definitions

Unless the context indicates otherwise, when used herein, the terms "imageable element", "lithographic printing plate precursor", and "printing plate precursor" are meant to be references to embodiments of the present invention.

In addition, unless the context indicates otherwise, the various components described herein such as "polymeric binder", "initiator", "free radically polymerizable component", "infrared radiation absorbing compound", and similar terms also refer to mixtures of such components. Thus, as used herein to define various components of the imageable layers and formulations, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Moreover, unless otherwise indicated, percentages refer to percents by total dry weight, for example, weight % based on total solids of either an imageable layer or radiation-sensitive composition. Unless otherwise indicated, the percentages can be the same for either the dry imageable layer or the total solids of radiation-sensitive composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers, homopolymers, and copolymers, which are defined for this invention to have a molecular weight of at least 500.

The term "copolymer" refers to polymers that are derived from two or more different monomers. The copolymers used in this invention generally comprise different recurring units derived from different ethylenically unsaturated polymerizable monomers (such as the A, B, C, and D recurring units defined below) in random order along the copolymer backbone.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

The terms "positive-working" and "negative-working" have the conventional meanings given in the art as described in the Background of the Invention above.

Polymeric Binders

As noted above, specific polymeric binders are used in the imageable elements to provide the advantages described above. One or more of these polymeric binders can be used in the same or different layers of the imageable element. Each of these polymeric binders has an acid number of at least 40 mg KOH/g of polymer and each of the polymeric binders comprises, in random order, at least 3 weight % of recurring units derived from one or more N-alkoxymethyl (alkyl)acrylamides or alkoxymethyl (alkyl)acrylates, at least 2 weight % of recurring units having pendant 1H-tetrazole groups, and at least 10 weight % of recurring units having pendant cyano groups.

In some embodiments, each of the polymeric binders has an acid value of at least 30 mg KOH/g of polymer to and including 150 mg KOH/g of polymer. The acid value can be determined using known methods.

For example, the polymeric binder can be represented by the following Structure (I):

-(A)$_w$-(B)$_x$-(C)$_y$-(D)$_z$-      (I)

wherein A represents recurring units derived from one or more N-alkoxymethyl (alkyl)acrylamides or alkoxymethyl (alkyl)acrylates, B represents recurring units having pendant cyano groups, C represents recurring units having pendant 1H-tetrazole groups, and D represents one or more different recurring units other than those for A, B, and C, and w is at least 2 weight % to and including 80 weight %, x is at least 10 weight % to and including 85 weight %, y is at least 5 weight % to and including 80 weight %, and z is at least 10 weight % to and including 85 weight %, all based on total polymeric binder weight.

In addition, in other embodiments, w is at least 3 weight % to and including 30 weight %, x is at least 30 weight % to and including 70 weight %, y is at least 10 weight % to and including 40 weight %, and z is at least 15 weight % to and including 40 weight %, all based on total polymeric binder weight.

In general, the N-alkoxymethyl (alkyl)acrylamides and the alkoxymethyl (alkyl)acrylates independently have alkoxy groups having 1 to 8 carbon atoms (more likely from 1 to 4 carbon atoms), and alkyl groups that are methyl or ethyl groups.

For example, the A recurring units can be derived from one or more ethylenically unsaturated polymerizable monomers represented by the following Structure (II):

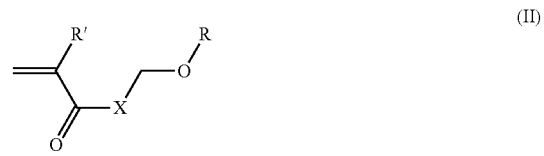

wherein R is a substituted or unsubstituted, branched or linear alkyl group having 1 to 8 carbon atoms (such as methyl, methoxymethyl, ethyl, iso-propyl, n-butyl, n-hexyl, benzyl, and n-octyl groups), a substituted or unsubstituted, branched or linear alkenyl group having 1 to 6 carbon atoms (such as allyl, vinyl, and 1,2-hexenyl groups), a substituted or unsubstituted cycloalkyl group having 5 or 6 carbon atoms in the carbocylic ring (such as cyclohexyl, p-methylcyclohexyl, and m-chlorocyclohexyl groups), or a substituted or unsubstituted phenyl group (such as phenyl, p-methoxyphenyl, p-ethylphenyl, and 2-chlorophenyl). For example, R can be a substituted or unsubstituted alkyl group having 1 to 4 carbon atoms, a substituted or unsubstituted cyclohexyl group, or a substituted or unsubstituted phenyl group.

R' is hydrogen or a substituted or unsubstituted, linear or branched alkyl group having 1 to 4 carbon atoms (such as methyl, methoxy, ethyl, iso-propyl, t-butyl, and n-butyl). Typically, R' is hydrogen or methyl.

X is —O— or —NH—.

For example, the A recurring units can be derived from one or more of N-methoxymethyl methacrylamide, N-iso-propoxymethyl methacrylamide, N-n-butoxymethyl methacrylamide, N-isobutoxymethyl methacrylamide, N-t-butoxymethacrylamide, N-ethylhexyloxymethacrylamide, N-ethoxymethyl acrylamide, N-methoxymethyl acrylamide, iso-propoxymethyl methacrylate, N-cyclohexyloxymethyl methacrylamide, phenoxymethyl methacrylate, methoxymethyl acrylate, N-cyclohexyloxymethyl acrylamide, phenoxymethyl acrylate, and ethoxymethyl acrylate.

The B recurring units can be derived from one or more ethylenically unsaturated polymerizable monomers having a pendant cyano group, including but not limited to, one or more (meth)acrylonitriles such as acrylonitrile and methacrylonitrile, cyanostyrenes such as p-cyanostyrene, and cyano (meth)acrylates such as ethyl-2-cyanomethyl methacrylate.

The C recurring units can be derived from one or more ethylenically unsaturated polymerizable monomers that have a pendant 1H-tetrazole group and one or more ethylenically unsaturated free radical polymerizable groups. In an alkaline solution, the tetrazole groups lose a hydrogen atom at the 1-position, as illustrated in the following Equation (1):

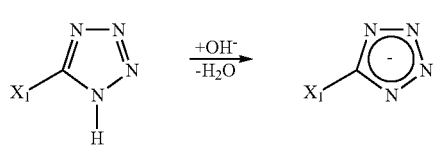

wherein $X_1$ represents the remainder of a non-polymeric molecule or a linking group connected to a polymer backbone. In many embodiments (but not all), the 1H-tetrazole is connected at its 5-position to a nitrogen.

The 1H-tetrazole groups can be attached to the ethylenically unsaturated groups that form part of the polymeric binder backbone through a linking group L comprising a —C(=O)—NR$^1$—, —NR$^1$—(C=O)—NR$^2$—, —S—, —OCO(=O)—, or —CH=N— group, or a combination thereof. Particularly useful linking groups include —C(=O)—NR$^1$— and —NR$^1$—(C=O)—NR$^2$—. The noted linking groups can be directly attached to the backbone or attached through an organic group having up to 30 atoms in the linking chain.

Examples of useful ethylenically unsaturated polymerizable monomers of this type are identified as $A_1$ through $A_8$ in TABLE A of U.S. Patent Application Publication 2009/0142695 (noted above) that is incorporated herein by reference.

Alternatively, the 1H-tetrazole groups can be introduced into the polymeric binder after it has formed. For example, the 1H-tetrazole groups can be introduced into polymers already having reactive functionalities for the amino group in 1H-tetrazole-5-amine. Examples of such reactive polymers have reactive isocyanato groups, (meth)acrylate groups, epoxy groups, nitrile groups, halomethyl group, cyclic anhydride of dicarboxylic acids or reactive aldehyde or ketone groups as shown above. Typical examples of such reactive polymers are those derived from isocyanatoethyl methacrylate, glycidyl methacrylate, (meth)acrylonitrile, chloromethylated styrene, maleic acid anhydride, and methyl vinyl ketone. For example, (meth)acrylate functionalized polymers that can react with 1H-tetrazole-5-amine are typically made by introduction of the (meth)acrylic functionality into a polymer, for example, by reaction of —OH groups with (meth)acrylic acid chloride or by introducing β-halogeno-substituted propionic acid groups followed by dehydrohalogenation.

The D recurring units can be obtained from one or more (for example 2 or 3 different) ethylenically unsaturated polymerizable monomers other than those represented by A, B, and C. Representative monomers of this type include but are not limited to, monomers having one or more carboxy, sulfo, or phospho groups, and those represented by Structures D1 through D5 of U.S. Patent Application Publication 2009/0042135 (noted above) that is incorporated herein by reference. For example, D recurring units can be derived from one or more styrenes, (meth)acrylates, (meth)acrylamides, N-phenylmaleimides, isopropyl(meth)acrylamides, and maleic anhydride. Other useful monomers would be readily apparent to one skilled in the art using a routine amount of experimentation.

The polymeric binders used in this invention can be formed using conventional reaction conditions that would be readily understood by one skilled in polymer chemistry. Representative synthetic methods are shown below with the Examples. The reactants can be obtained from a number of commercial sources or prepared using known procedures.

The polymeric binder can be present in the imageable layer generally in an amount of at least 40 weight % to and including 98 weight %, and typically at least 70 weight % to and including 96 weight %, all based on total dry imageable layer weight. The polymeric binders described above generally are the "predominant" polymeric binders and comprise at least 60 weight % to and including 100 weight % of the total amount of polymeric binders in the imageable layer.

Positive-Working Imageable Elements

Useful embodiments of this invention are positive-working imageable elements each of which comprises at least one imageable layer comprising a polymeric binder as described above.

Some embodiments of such positive-working imageable elements comprise a single imageable layer while others comprise an inner imageable layer and an outer imageable layer disposed on the inner imageable layer. The polymer having the pendant 1H-tetrazole groups described above can be dispersed within the single imageable layer, or in either or both of the inner and outer imageable layers of the multi-layer imageable elements. In most embodiments, the polymer is present in only one of the two imageable layers in such elements.

Single-Layer Positive-Working Imageable Elements

In general, single-layer imageable elements are formed by suitable application of an imageable layer formulation containing one or more polymeric binders as described above to a suitable substrate to form an imageable layer. This substrate is generally treated or coated in various ways as described below prior to application of the formulation. The substrate can be treated to provide an "interlayer" for improved adhesion or hydrophilicity and the single imageable layer is applied over the interlayer.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is generally in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that can be treated using techniques known in the art, including roughening of some type by physical (mechanical) graining, electrochemical graining, or chemical graining, generally followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 $g/m^2$ to and including 5 $g/m^2$ and more typically at least 3 $g/m^2$ to and including 4.3 $g/m^2$. Phosphoric acid anodization generally provides an oxide weight on the surface of at least 1.5 $g/m^2$ to and including 5 $g/m^2$ and more typically at least 1 $g/m^2$ to and including 3 $g/m^2$. When sulfuric acid is used for anodization, higher oxide weight (at least 3 $g/m^2$) can provide longer press life.

The aluminum support can also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

The single-layer, positive-working imageable element also includes one or more infrared radiation absorbing compounds generally having spectral sensitivity to at least 700 nm to and including 1400 nm and typically at least 700 to and including 1250 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

A general description of one class of suitable cyanine dyes is shown by the formula in paragraph [0026] of WO 2004/101280 (Munnelly et al.), incorporated herein by reference, and useful IR absorbing compounds are identified below with the Examples and IR Dyes A and B.

Details of other useful bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Still other useful infrared radiation absorbing compounds are copolymers that can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compound is generally present in the imageable element in an amount sufficient to render the imageable layer insoluble to an aqueous developer after exposure to appropriate radiation. This amount is generally at least 0.5 weight % and up to and including 30 weight % and typically at least 3 weight % to and including 10 weight % (based on total dry layer weight). In most embodiments, the radiation absorbing compound is present in the single imageable layer. Alternatively or additionally, radiation absorbing compounds can be located in a separate layer that is in thermal contact with the first layer. Thus, during imaging, the action of the radiation absorbing compound can be transferred to the first layer without the compound originally being incorporated into it.

In addition, solubility-suppressing components are optionally incorporated into the single imageable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The imageable layer can also include additional polymers or polymeric binders other than the "predominant" polymeric binders that provide the advantages the present invention. These additional polymers can be poly(vinyl phenols) or derivatives thereof, or phenolic polymers. They can include carboxylic (carboxy), sulfonic (sulfo), phosphonic (phosphono), or phosphoric acid groups that are incorporated into the polymer molecule. Other useful additional polymers include but are not limited to, novolak resins, resole resins, poly(vinyl acetals) having pendant phenolic groups, and mixtures of any of these resins (such as mixtures of one or more novolak resins and one or more resole resins). The novolak resins are most useful in combination with the predominant polymeric binders. Generally, such resins have a number average molecular weight of at least 3,000 and up to and including 200,000, and typically at least 6,000 to and including 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful additional resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in U.S. Patent Application Publication 2008/0008956 (Levanon et al.) that are incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of at least 1,000 to and including 30,000, preferably at least 1,000 to and including 10,000, and more preferably at least 3,000 to and including 7,000. In addition, they can have a polydispersity less than 2 and preferably of at least 1.5 to and including 1.9. The branched poly(hydroxystyrenes) can be homopolymers or copolymers with non-branched hydroxystyrene recurring units.

One group of useful polymeric binders includes poly(vinyl phenol) and derivatives thereof. Such polymers are obtained generally by polymerization of vinyl phenol monomers, that is, substituted or unsubstituted vinyl phenols. Substituted vinyl phenol recurring units include those described below for the "a" recurring units in Structure (I). Some vinyl phenol copolymers are described in EP 1,669,803A (Barclay et al.).

Other useful polymeric binders are modified novolak or resole resins that are represented by Structure (POLYMER):

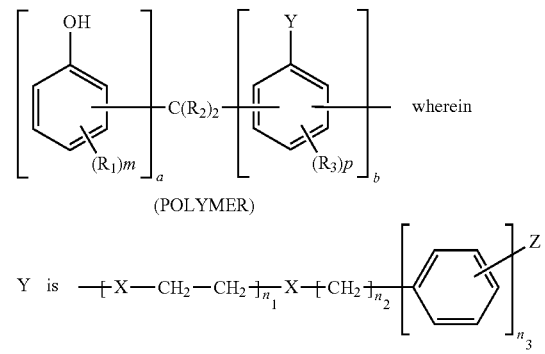

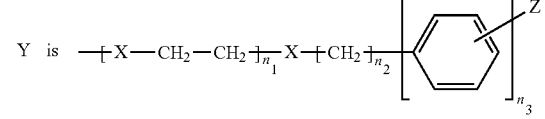

a is at least 90 mol % to and including 99 mol % (typically at least 92 mol % to an including 98 mol %),
b is at least 1 mol % to and including 10 mol % (typically at least 2 mol % to and including 8 mol %),
$R_1$ and $R_3$ are independently hydrogen or hydroxy, alkyl, or alkoxy groups, $R_2$ is hydrogen or an alkyl group,
X is an alkylene, oxy, thio, —OC(=O)Ar—, —OC(=O)CH=CH—, or —OCO(CH$_2$)$_{n4}$— group wherein Ar is an aryl group, m and p are independently 1 or 2, $n_3$ is 0 or an integer up to 5 (for example 0, 1, 2, or 3), $n_2$ is 0 or an integer up to 5 (for example, 0, 1, or 2), $n_3$ is 0 or 1 (typically 0), $n_4$ is at least 1 (for example, up to 8), and Z is —C(=O)OH, —S(=O)$_2$OH, —P(=O)(OH)$_2$, or —OP(=O)(OH)$_2$.

The alkyl and alkoxy groups present in the primary polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also includes "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain. Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the polymeric binder comprises recurring units represented by Structure (POLYMER) wherein "a" is at least 92 mol % to and including 98 mol %, "b" is at least 2 to and including 8 mol % and Z is —C(=O)OH, and is present at a dry coverage of at least 15 weight % to and including 100 weight % based on the total dry weight of the layer.

Other polymeric binders that can be in the imageable layer include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). Other useful polymeric binders include acrylate copolymers as described for example in EP 737,896A (Ishizuka et al.), cellulose esters and poly(vinyl acetals) as described for example in U.S. Pat. No. 6,391,524 (Yates et al.), DE 10 239 505 (Timpe et al.), and WO 2004081662 (Memetea et al.).

The additional polymeric binder can be present in the imageable layer at a dry coverage of at least 15 weight % to and including 70 weight % (typically at least 30 weight % to and including 60 weight %) based on the total dry imageable layer weight.

The single imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be at least 0.5 g/m$^2$ to and including 2.5 g/m$^2$ and typically at least 1 g/m$^2$ to and including 2 g/m$^2$.

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art.

Alternatively, the layer(s) can be applied by conventional extrusion coating methods from melt mixtures of the respective layer compositions. Typically, such melt mixtures contain no volatile organic solvents.

Intermediate drying steps can be used between applications of the various layer formulations to remove solvent(s) before coating other formulations. Drying steps can also help in preventing the mixing of the various layers.

Multi-Layer Positive-Working Imageable Elements

In general, the multi-layer, positive-working imageable elements of this invention comprise a substrate, an inner layer (also known in the art as an "underlayer"), and an outer layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer layer are soluble in the alkaline developer. The inner layer is also generally removable by the alkaline developer. An infrared radiation absorbing compound (described above) can also be present in such imageable elements in various locations. For example, it can be present in only the inner layer, within both the inner layer and the outer layer, or within a separate layer between the inner and outer layers. In some embodiments, no infrared radiation absorbing compound is purposely incorporated into the outer layer. In still other embodiments, an infrared radiation absorbing compound is present only in the outer layer, for example, as in some embodiments as described in copending and commonly assigned U.S. Ser. No. 13/602,367 (noted above), the disclosure of which is incorporated herein by reference. When multiple layers comprise an infrared radiation absorbing compound, the infrared radiation absorbing compounds can be the same or different in the various layers, or each layer can have the same or different mixture of infrared radiation absorbing compounds.

The imageable elements are formed by suitable application of an inner layer composition onto a suitable substrate. This substrate can be an untreated or uncoated support but it is generally treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. Further details of such substrates are provided above.

The inner layer is disposed between the outer layer and the substrate. Typically, it is disposed directly on the substrate (including any hydrophilic coatings as described above). The inner layer comprises a first polymeric binder that is removable by the lower pH developer and typically soluble in the developer to reduce sludging of the developer. In addition, the first polymeric binder is generally insoluble in the solvent used to coat the outer layer so that the outer layer can be coated over the inner layer without dissolving the inner layer. Mixtures of these first polymeric binders can be used if desired in the inner layer. This first polymeric binder generally comprises one or more of the "predominant" polymeric binders described above. Such polymeric binders are generally present in the inner layer in an amount of at least 10 weight %, and generally at least 30 weight % to and including 45 weight % of the total dry inner layer weight.

Other useful polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. Still other useful polymeric binders include polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Polymeric binders of this type include copolymers that comprise at least 60 mol % to and including 95 mol % of recurring units derived from N-phenylmaleimide, N-cyclohexyl-maleimide, N-(4-carboxyphenyl)maleimide, N-benzylmaleimide, or a mixture thereof, at least 10 mol % to and including 50 mol % of recurring units derived from acrylamide, methacrylamide, or a mixture thereof, and at least 5 mol % to and including 30 mol % of recurring units derived from methacrylic acid. Other hydrophilic monomers, such as hydroxyethyl methacrylate, can be used in place of some or all of the methacrylamide. Other alkaline soluble monomers, such as acrylic acid, can be used in place of some or all of the methacrylic acid. Optionally, these polymers can also include recurring units derived from (meth)acrylonitrile or N-[2-(2-oxo-1-imidazolidinyl)ethyl]-methacrylamide.

Still other useful additional polymeric binders in the inner layer can comprise, in polymerized form, at least 5 mol % to and including 30 mol % of recurring units derived from an ethylenically unsaturated polymerizable monomer having a carboxy group (such as acrylic acid, methacrylic acid, itaconic acid, and other similar monomers known in the art (acrylic acid and methacrylic acid are preferred), at least 20 mol % to and including 75 mol % of recurring units derived from N-phenylmaleimide, N-cyclohexylmaleimide, or a mixture thereof, optionally, at least 5 mol % to and including 50 mol % of recurring units derived from methacrylamide, and at least 3 mol % to and including 50 mol % as described for example in U.S. Pat. No. 7,186,482 (Kitson et al.). Methods of preparation of certain of these polymeric materials are disclosed in U.S. Pat. No. 6,475,692 (Jarek).

Additional useful polymeric binders for the inner layer are described for example, in U.S. Pat. No. 7,144,661 (Ray et al.), U.S. Pat. No. 7,163,777 (Ray et al.), and U.S. Pat. No. 7,223,506 (Kitson et al.), and U.S. Patent Application Publications 2006/0257764 (Ray et al.), 2007/0172747 (Ray et al.), and 2009/0042135 (Tao et al.).

The inner layer can also comprise one or more additional polymeric materials that are resins having activated methylol or activated alkylated methylol groups. The additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical). The resin having activated methylol or activated alkylated methylol groups is typically a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide). Useful additional polymeric materials can also include copolymers that comprise at least 25 mol % to and including 75 mol % of recurring units derived from N-phenylmaleimide, at least 10 mol % to and including 50 mol % of recurring units derived from methacrylamide, and at least 5 mol % to and including 30 mol % of recurring units derived from methacrylic acid. These additional copolymers are disclosed in U.S. Pat. No. 6,294,311 (Shimazu et al.) and U.S. Pat. No. 6,528,228 (Savariar-Hauck et al.).

In some embodiments, only the inner layer further comprises an infrared radiation absorbing compound as defined above. In other embodiments, the infrared radiation absorbing compound is present only in the outer layer.

The infrared radiation absorbing compound can be present in the multi-layer imageable element in an amount of generally at least 0.5 weight % and to and including 30 weight % and typically at least 3 weight % to and including 25 weight %, based on the total dry weight of the layer in which the compound is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, colorants, or organic or inorganic particles.

The inner layer generally has a dry coating coverage of at least 0.5 g/m$^2$ to and including 2.5 g/m$^2$ and typically of at least 1 g/m$^2$ to and including 2 g/m$^2$. The total polymeric binders described above generally comprise at least 50 weight % and typically at least 60 weight % to and including 90 weight % based on the total dry layer weight, and this amount can be varied depending upon what other polymers and chemical components are present.

The outer layer of the imageable element is disposed over the inner layer and in most embodiments there are no intermediate layers between the inner and outer layers. The outer layer comprises one or more polymeric binders that are generally different than the polymeric binders in the inner layer. These outer layer polymeric binders can be those described for example, in U.S. Pat. No. 7,163,770 (Saraiya et al.), U.S. Pat. No. 7,160,653 (Huang et al.), and U.S. Pat. No. 7,582,407 (Savariar-Hauck et al.), all incorporated herein by reference. [This is already stated above]

The one or more polymeric binders are present in the outer layer at a dry coverage of at least 15 weight % to and including 100 weight %, typically at least 70 weight % to and including 98 weight %, based on total dry weight of the outer layer.

The outer layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element. The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of at least 0.2 g/m² to and including 2 g/m² and typically of at least 0.4 g/m² to and including 1.5 g/m².

There can be a separate layer that is between and in contact with the inner and outer layers. This separate layer can act as a barrier to minimize migration of infrared radiation absorbing compound(s) from the inner layer to the outer layer. This separate "barrier" layer generally comprises other polymeric binders that are soluble in the alkaline developer. If this polymeric binder is different from the polymeric binder(s) in the inner layer, it is typically soluble in at least one organic solvent in which the inner layer polymeric binders are insoluble. A useful polymeric binder for the barrier layer is a poly(vinyl alcohol). Generally, this barrier layer should be less than one-fifth as thick as the inner layer, and typically less than one-tenth as thick as the inner layer.

Alternatively, there can be a separate layer between the inner and outer layers that contains the infrared radiation absorbing compound(s), which can also be present in the inner layer, or solely in the separate layer.

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support.

The selection of solvents used to coat both the inner and outer layers depends upon the nature of the polymeric binders and other components in the formulations. To prevent the inner and outer layer formulations from mixing or the inner layer from dissolving when the outer layer formulation is applied, the outer layer formulation should be coated from a solvent in which the polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers can be applied by extrusion coating methods from melt mixtures of the respective layer compositions. Typically, such melt mixtures contain no volatile organic solvents.

Intermediate drying steps can be used between applications of the various layer formulations to remove solvent(s) before coating other formulations. Drying steps can also help in preventing the mixing of the various layers.

After drying the layers, the multi-layer imageable element can be further "conditioned" with a heat treatment of at least 40° C. to and including 90° C. for at least 4 hours (for example, at least 20 hours) under conditions that inhibit the removal of moisture from the dried layers. For example, the heat treatment is carried out at from 50° C. to and including 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web. When conditioned in a stack, the individual imageable elements can be separated by suitable interleaving papers. Such papers are available from several commercial sources. The interleaving papers can be kept between the imageable elements after conditioning during packing, shipping, and use by the customer.

Imaging Conditions

The imageable elements can have any useful form and size or shape including but not limited to, printing plate precursors, printing cylinders, printing sleeves (both hollow or solid), and printing tapes (including flexible printing webs).

During use, the positive-working imageable elements are exposed to a suitable source of imaging or exposing radiation at a wavelength of at least 700 nm to and including 1500 nm. For example, imaging can be carried out using imaging or exposing radiation, such as from an infrared laser (or array or lasers) at a wavelength of at least 750 nm and up to and including 1400 nm and typically at least 750 nm and up to and including 1250 nm. Imaging can be carried out using imaging radiation at multiple wavelengths at the same time if desired.

The laser used to expose the imageable element is generally a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can function solely as a platesetter or it can be incorporated directly into a lithographic printing press. In the latter case, printing can commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful near-infrared and infrared imaging apparatus is available as models of Kodak® Trendsetter or Kodak® Quantum 800 imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Development and Printing

With or without the need for a preheat step after imaging, the imaged elements can be developed "off-press" using conventional processing and aqueous solutions such as developers (or also known as "processing solutions").

The developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally at least 4 to and including 14. In some embodiments, the developers have a pH of at least 6 to and including 14, at least 6 to and including 12.5, or at least 7 to and including 12. In still other embodiments, the developer is silicate-free and has a pH of at least 11 or at least 12 to and including 14, or at least 12.5 to and including 14. The imaged elements are generally developed using conventional processing conditions. Aqueous alkaline developers and organic solvent-containing alkaline developers can be used. "Silicate-free" developers are developers into which no silicates or metasilicates are purposely incorporated or that comprise a silicate in an amount of less than 1 weight % based on total developer weight.

Organic solvent-containing alkaline developers are generally single-phase solutions of one or more organic solvents that are miscible with water, and generally have a pH below 12.5 such as a pH of at least 6 to and including 12 or typically at least 7 to and including 11.5. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of at least 0.5 weight % to and including 15 weight % based on total developer weight.

Representative organic solvent-containing alkaline developers include ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa).

Useful silicate-containing aqueous alkaline developers generally have a pH of at least 7 and typically of at least 11 and up to and including 14. Such developers include but are note limited to, 3000 Developer, 9000 Developer, Goldstar® Developer, Goldstar® Plus Developer, Goldstar® Premium Developer, Kodak Thermal 300 Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo), and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring —(CH$_2$—CHR$_a$—O)— units in which R$_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

Developers having a pH of from about 4 to about 11 are useful for developing imaged elements in the absence of post-rinse and gumming steps after development (so called "single bath development"). Such developers contain in most cases hydrophilic polymers like gum Arabic, polyvinyl alcohol, poly(acrylic acid), or other hydrophilic polymers to protect the developed plate against fingerprints and to prevent toning of the plate when used on a printing press.

Generally, a developer is applied to the imaged element by rubbing or wiping the outer layer with an applicator containing the developer. Alternatively, the imaged element can be brushed with the developer or the developer can be applied by spraying the outer layer with sufficient force to remove the exposed regions. Still again, the imaged element can be immersed in the developer. In all instances, a developed image is produced in a lithographic printing plate having excellent resistance to press room chemicals. These development processes can be carried out in suitable developing processors or equipment using standard residence times and recirculation and replenishment rates.

Following this off-press development, the imaged element can be rinsed with water and dried in a suitable fashion. The dried element can also be treated with a conventional gumming solution (preferably gum arabic). In addition, a post-bake operation can be carried out, with or without a blanket exposure to UV or visible radiation. Alternatively, a post-UV floodwise exposure (without heat) can be used to enhance the performance of the imaged element.

In alternative embodiments, with or without a post-exposure baking step after imaging and before development, the imaged elements can be developed "off-press" using a gum (or gum solution) as described below. A gum solution is typically an aqueous liquid that comprises one or more surface protective compounds capable of protecting the lithographic image of the printing plate against contamination (for example, oxidation, fingerprints, dust or scratches). There are generally two types of "gum" solutions known in the art: (1) a "bake", "baking", or "pre-bake" gum generally contains one or more compounds that do not evaporate at the usual pre-bake temperatures used for making lithographic printing plates, typically an anionic or nonionic surfactant, and (2) a "finisher" gum that generally contains one or more hydrophilic polymers (both synthetic and naturally-occurring, such as gum Arabic cellulosic compounds, (meth)acrylic acid polymers, and polysaccharides) that are useful for providing a protective overcoat on a printing plate. The gums used in the practice of these embodiments would be generally considered "pre-bake" gums, and thus, generally lack the hydrophilic polymers.

The gum can be provided in diluted or concentrated form. The amounts of components described below refer to amount in the diluted gum that is likely its form for use in the practice of the invention. However, it is to be understood that concentrated gums can be used and the amounts of various components (such as the anionic surfactants) would be correspondingly increased.

The gum is an aqueous solution that generally has a pH of at least 3 and up to and including 9 as adjusted using a suitable amount of a base. The viscosity of the gum can be adjusted to a value of at least 1.7 to and including 5 cP by adding a suitable amount of a viscosity increasing compound such as a poly(vinyl alcohol) or poly(ethylene oxide).

In addition, these gums have one or more anionic surfactants as the only essential component, even though optional components (described below) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Several commercial examples are described in the Examples below. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically at least 1 weight % to and including 45 weight %, or at least 3 weight % to and including 30 weight % (based on the weight of gum). Two or more anionic surfactants ("first", "second", etc.) can be used in combination. In such mixtures, a first anionic surfactant, such as an alkyldiphenyloxide disulfonate, can be present generally in an amount of at least 1 weight % and typically at least 3 weight % to and including 30 weight %. A second surfactant can be present (same or different from the first anionic surfactant) in a total amount of at least 0.1 weight %, and typically at least 2 weight % to and including 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The gums can include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglycol. These nonionic surfactants can be present in an amount of up to and including 10 weight %, but at generally less than 2 weight %.

Other optional components of the gum include inorganic salts (such as those described in [0032] of U.S. Patent Application 2005/0266349, noted above), wetting agents (such as a glycol), a metal chelating agents, antiseptic agents, antifoaming agents, ink receptivity agents (such as those described in [0038] of US '349), and viscosity increasing agents as noted above. The amounts of such components are known in the art. Calcium ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines can also be useful. A chelating agent can be present in the gum in an amount of at least 0.001 weight % to and including 1 weight %.

Generally, the gum is applied to the imaged element by rubbing, spraying, jetting, dipping, coating, or wiping the outer layer with the gum or a roller, impregnated pad, or applicator containing the gum. For example, the imaged element can be brushed with the gum, or the gum can be poured on or applied by spraying the outer layer with sufficient force to remove the exposed regions using a spray nozzle system as described for example in [0124] of EP 1,788,431A2 (noted above). Still again, the imaged element can be immersed in the gum and rubbed by hand or with an apparatus.

The gum can also be applied in a gumming unit (or gumming station) that has at least one roller for rubbing or brushing the printing plate while the gum is applied during development. By using such a gumming unit, the exposed regions of the imaged layer can be removed from the substrate more completely and quickly. The gum used in development can be collected in a tank and the gum can be used several times, and replenished if necessary from a reservoir of gum. The gum replenisher can be of the same concentration as that used in development, or be provided in concentrated form and diluted with water at an appropriate time.

Following off-press development, a postbake operation can be carried out, with or without a blanket or floodwise exposure to UV, visible, or infrared radiation, for example by exposure to "white" light. Or, baking can be carried out in a hot air circulation oven. The imaged and developed element can be baked in a postbake operation to increase run length of the resulting imaged element. Baking can be carried out, for example at from about 160° C. to about 220° C. for from about 30 seconds to about 10 minutes, with or without the noted UV, visible or IR exposure, in a suitable apparatus (for example, hot air circulating oven that can be static or a conveyor oven).

Thus, whatever the developing process, the method of this invention can be carried out by omitting the post-exposure baking step and removing predominantly only the exposed regions by development to provide a positive-working lithographic printing plate having a hydrophilic aluminum-containing substrate.

As one skilled in the art would know, such development processes can remove insignificant amounts of the non-exposed regions but not enough to significantly affect the desired image.

The following Examples are provided to illustrate the practice of the present invention and not to be limited in any way.

Invention Examples 1-2 and Comparative Examples 1-4

The following chemicals were used in the Examples:

Ethyl violet is assigned C.I. 42600 (CAS 2390-59-2, λmaz = 596 nm) and has a formula of p-$(CH_3CH_2)_2NC_6H_4)_3C^+$ Cl$^-$ IR Dye A (Trump) is represented by the following formula and can be obtained from Eastman Kodak Company (Rochester, NY).

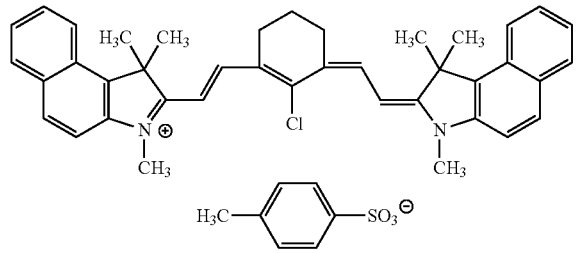

IR Dye B is represented by the following formula and can be obtained from FEW (Germany)

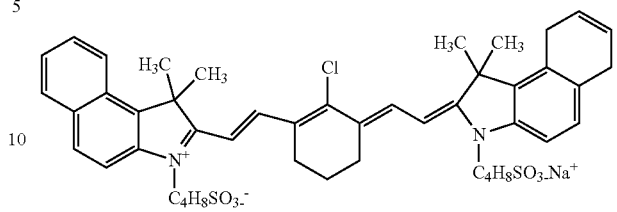

S 0306 FEW

DEK represents diethyl ketone

PM is propylene glycol methyl ether that was obtained from Dow Chemical (USA).

PMA represents 1-methoxy-2-propyl acetate.

BLO is γ-butyrolactone.

Byk® 307 is a polyethoxylated dimethylpolysiloxane copolymer that is available from Byk Chemie (Wallingford, CT)

Substrate A is a 0.3 mm gauge aluminum sheet that had been electrograined, anodized, and subjected to treatment poly(vinyl phosphonic acid).

D11 is a triarylmethane dye (CAS 433334-19-1).

DMABA is dimethylaminobenzoic acid.

RX04 is a styrene-maleic anhydride copolymer.

SPN562 is a 44% solution of m-cresol novolak from AZ Chemicals (Germany).

Resin A is described below.

Solvent Mixture A is a mixture of MEK/PM/BLO/water (45/35/10/10 wt. %)

Copolymers A to F were prepared by conventional conditions and procedures with mole ratios of reactive monomers as shown below in TABLE I.

TABLE I

| Component | Mole % | | | | | |
| --- | --- | --- | --- | --- | --- | --- |
| | Copolymer A | Copolymer B | Copolymer C | Copolymer D | Copolymer E | Copolymer F |
| Methacrylamide-N-tetrazole | 10.0 | 15.0 | 31.0 | 13.0 | 0 | 0 |
| Methacrylic acid | 4.0 | 0 | 0 | 4.0 | 14.0 | 25 |
| N-Phenylmaleimide | 10.0 | 9.5 | 40 | 18.0 | 10.0 | 40 |
| Methacrylamide | X | 0 | X | 10.0 | 0 | 15 |
| Acrylonitrile (AN) | 66 | 66.5 | X | 55.0 | 66.0 | 0 |
| N-Methoxymethyl methacrylamide | 10.0 | 9.0 | X | X | 10 | 20 |
| N-(2-Methacryloyloxyethyl) ethylene urea | 0 | 0 | 29 | X | X | 0 |
| Theoretical AN | 111 | 97 | 99 | 103 | 103 | 108 |
| Relative mol. wt. (GPC Polystyrene standards) | 47,925 | 65,944 | 85,175 | 54,780 | 32,322 | 58,050 |

Synthesis of Resin A:

A 500 ml 3-neck round-bottomed flask fitted with reflux was set-up in a thermostatic water bath. To the flask containing 236.21 g of SPN562 were added 180 g of Dowanol® PM. The solution was heated to 85° C. and 26.7 g of KOH ground to fine powder were added and the solution was stirred for 10 minutes. This was followed by addition of 12.76 g of chloroacetic acid and the reaction was allowed to continue at 85° C. for 5 hours. After this time, the reaction mixture was neutralized with 29.0 g of HCl (33%). The solution was then poured into water in a 1 liter beaker and ground, giving a fine suspension (pH approx. 4). The resulting polymer was filtered and washed on the filter with water to pH 6-7 and then dried in an oven at 40° C. overnight.

Positive-working lithographic printing plate precursors were prepared as follows:

The inner layer (bottom layer, BL) for Elements A to E was prepared by dissolving the components shown below in TABLE II in the noted solvent mixture. The resulting solutions were coated onto Substrate A and dried at 135° C. for 45 seconds to provide a dry coating weight of 1.35 g/m² in each instance.

TABLE II

| | BL Element A | BL Element B | BL Element C | BL Element D | BL Element E | BL Element F |
|---|---|---|---|---|---|---|
| Polymer A | 2.30 g | 0 | 0 | 0 | 0 | 0 |
| Polymer B | 0 | 2.30 g | 0 | 0 | 0 | 0 |
| Polymer C | 0 | 0 | 2.30 g | 0 | 0 | 0 |
| Polymer D | 0 | 0 | 0 | 2.30 g | 0 | 0 |
| Polymer E | 0 | 0 | 0 | 0 | 2.30 g | 0 |
| Polymer F | 0 | 0 | 0 | 0 | 0 | 2.30 g |
| IR Dye B | 0.15 g | 0.15 g | 0.15 g | 0.15 g | 0.15 g | 0.15 g |
| D11 | 0.04 g | 0.04 g | 0.04 g | 0.04 g | 0.04 g | 0.04 g |
| Byk ® 307 | 0.04 g | 0.04 g | 0.04 g | 0.04 g | 0.04 g | 0.04 g |
| Solvent Mixture A | 37.5 g | 37.5 g | 37.5 g | 37.5 g | 37.5 g | 37.5 g |

Top Layer A (outer layer) formulation was prepared by dissolving 3.8 g of Resin A, 0.96 g of RX04, 0.03 g of Ethyl Violet, and 0.04 g of Byk® 307 in 76 g of a solvent mixture of DEK/PMA 92/8 wt. %.

Imageable Elements A-F were prepared by coating the Top Layer A formulation over each bottom layers A-F respectively to provide a dry coating weight of about 0.58 g/m².

Bakeability:

To evaluate the bakeability property of the inner layer in the imageable elements, strips of each coated bottom layer formulation were heated in an oven at 190° C., 220° C., or 240° C. for either 2 minutes or 5 minutes. To check the completion of baking, the deletion Fluid 243 was applied at various lengths of time up to 8 minutes and wiped off using a moist tissue. The extent of attack of the coating was then evaluated.

The removal of the coating with the deletion fluid was assessed visually and rated on a scale of 0-10 with 0 denoting complete removal of coating and 10 denoting full bakeability. The results are tabulated below in TABLE III.

TABLE III

| | 2 Minutes 190° C. | 5 Minutes 190° C. | 2 Minutes 200°C. | 5 Minutes 200° C. | 2 Minutes 220° C. | 5 Minutes 220° C. |
|---|---|---|---|---|---|---|
| BL Plate A (Invention Example 1) | 9.5 | 10 | 10 | 10 | 10 | 10 |
| BL Plate B (Invention Example 2) | 8 | 10 | 9 | 10 | 10 | 10 |
| BL Plate C (Comparative Example 1) | 1 | 2 | 2 | 3 | 5 | 5 |
| BL Plate D (Comparative Example 2) | 0 | 1 | 1 | 2 | 1 | 3 |
| BL Plate E (Comparative Example 3) | 10 | 10 | 10 | 10 | 10 | 10 |
| BL Plate F (Comparative Example 4) | 10 | 10 | 10 | 10 | 10 | 10 |

The results in TABLE III show that all the polymers derived from N-methoxymethyl methacrylamide exhibited inferior bakeability.

Solvent Resistance:

The solvent resistance of the inner layer formulations was determined by measuring the gravimetric soak loss of the BL-coated samples after 5 minutes soaking in the following solvent/water 80:20 mixtures containing corrosive press room solvents: Butyl Cellosolve (BC), dipropyleneglycol-monomethyl ether (DPME), and diacetone alcohol (DAA). The percentage loss after 5 minutes for each sample is recorded in the following TABLE IV.

TABLE IV

| | BC/ $H_2O$ | DPME/ $H_2O$ | DAA/ $H_2O$ |
|---|---|---|---|
| BL Plate A (Invention Example 1) | 0% | 0% | 4.0% |
| BL Plate B (Invention Example 1) | 2.% | 0% | 0% |
| BL Plate C (Comparative Example 1) | 6.0% | 5.0% | 7.0% |
| BL Plate D (Comparative Example 2) | 4.0% | 1.0% | 2.0% |
| BL Plate E (Comparative Example 3) | 7.0% | 73.0% | 88.0% |
| BL Plate F (Comparative Example 4) | 22.0% | 84.0% | 95.0% |

These data demonstrate that the imageable elements containing polymers having tetrazole recurring units exhibited excellent solvent resistance but exhibited inferior bakeability. In contrast, the imageable elements containing polymers having sufficient recurring units derived from N-alkoxymethyl (alkyl)acrylamides or N-alkoxymethyl (alkyl)acrylates exhibited desirable bakeability but undesirable solvent resistance. The data shown above also demonstrate that imageable elements containing tetrazole recurring units (Polymers A-D) exhibited better solvent resistance than the imageable elements in which recurring units from methacrylic acid were present in combination with recurring units derived from N-methoxymethyl methacrylamide. The results clearly show that the best synergistic results of solvent resistance and bakeability are achieved only when the imageable elements contain polymers that have both tetrazole recurring units and recurring units derived from N-methoxymethyl methacrylamide. Because of the unpredictability of combining various monomeric recurring units, the results achieved with the polymers described for this invention were unexpected.

Imageable Elements A-F (containing both inner and outer layers) were imaged with test patterns 6W to 16W in steps of 1W using a Kodak Quantum 800 imagesetter (39 to 102 mJ/cm²). The imaged elements were developed with 980 Developer in a Mercury processor at 2000 mm/min to provide lithographic printing plates A-F. The imaging and development results are shown in the following TABLE V.

TABLE V

| Element (Inner Layer Polymer) | Clear Point | 1 × 1 pixels | 8 × 8 pixels |
|---|---|---|---|
| Invention Example 1 (A) | 77 mJ/cm$^2$ | Good | 48.5 |
| Invention Example 2 (B) | 77 mJ/cm$^2$ | Good | 49.3 |
| Comparative Example 1 (C) | 77 mJ/cm$^2$ | Good | 50.5 |
| Comparative Example 2 (D) | 70 mJ/cm$^2$ | good | 48.9 |
| Comparative Example 3 (E) | 72 mJ/cm$^2$ | good | 50.5 |
| Comparative Example 4 (F) | 64 mJ/cm$^2$ | weak | 47.8 |

The clear point and 8×8 pixel dot size were noted and the 1×1 pixels evaluated visually. All the plates show desirable sensitivity and desirable resolution.

The data provided above demonstrate that copolymers derived from N-alkoxymethyl (alkyl)acrylamides or alkoxymethyl (alkyl)acrylates, acrylonitrile, and monomers with tetrazole moieties provide excellent solvent resistance and bakeability and are even superior to the polymers derived from (meth)acrylic acid.

The invention has been described in detail with particular reference to certain preferred embodiments thereof, but it will be understood that variations and modifications can be effected within the spirit and scope of the invention.

The invention claimed is:

1. A lithographic printing plate precursor comprising a substrate and having an imageable layer disposed thereon, which imageable layer comprises an infrared radiation absorbing compound and a polymeric binder having an acid number of at least 30 mg KOH/g of polymer to and including 150 mg KOH/g of polymer, the polymeric binder comprising, in random order, at least 3 weight % of recurring units derived from one or more N-alkoxymethyl (alkyl)acrylamides or alkoxymethyl (alkyl)acrylates, at least 2 weight % of recurring units having pendant 1H-tetrazole groups, and at least 10 weight % of recurring units having pendant cyano groups.

2. The printing plate precursor of claim 1 wherein the polymeric binder is represented by the following Structure (I), in random order:

  (I)

wherein A represents recurring units derived from one or more N-alkoxymethyl (alkyl)acrylamides or alkoxymethyl (alkyl)acrylates, B represents recurring units having pendant cyano groups, C represents recurring units having pendant 1H-tetrazole groups, and D represents one or more different recurring units other than those for A, B, and C, and w is at least 2 weight % to and including 80 weight %, x is at least 10 weight % to and including 85 weight %, y is at least 5 weight % to and including 80 weight %, and z is at least 10 weight % to and including 85 weight %, all based on total polymeric binder weight.

3. The printing plate precursor of claim 2 wherein w is at least 3 weight % to and including 30 weight %, x is at least 30 weight % to and including 70 weight %, y is at least 10 weight % to and including 40 weight %, and z is at least 15 weight % to and including 40 weight %, all based on total polymeric binder weight.

4. The printing plate precursor of claim 1 wherein the N-alkoxymethyl (alkyl)acrylamides and the alkoxymethyl (alkyl)acrylates independently have alkoxy groups having 1 to 8 carbon atoms, and alkyl groups that are methyl or ethyl groups.

5. The printing plate precursor of claim 1 wherein the polymeric binder is present in the imageable layer in an amount of from at least 40 weight % to and including 98 weight % based on total dry imageable layer weight.

6. The printing plate precursor of claim 1 that is positive-working and the infrared radiation absorbing compound is an infrared radiation absorbing dye.

7. The printing plate precursor of claim 1 that is positive-working and wherein the imageable layer is an inner layer disposed on the substrate, only the inner layer comprises the infrared radiation absorbing compound and the polymeric binder, and the printing plate precursor further comprising an outer layer disposed on the inner layer, which outer layer comprises a polymeric binder different from the polymeric binder in the inner layer.

8. The printing plate precursor of claim 1 that is positive-working and wherein the imageable layer is an inner layer disposed on the substrate, and the printing plate precursor further comprising an outer layer disposed on the inner layer, which outer layer comprises a polymeric binder different from the polymeric binder in the inner layer, and the same or different infrared radiation absorbing compound is present in both the inner layer and the outer layer.

9. A method comprising:
A) imagewise exposing the printing plate precursor of claim 1 to produce exposed and non-exposed regions, and
B) with or without a post-exposure preheat step, developing the imagewise exposed printing plate precursor to provide a lithographic printing plate.

10. The method of claim 9 wherein the imagewise exposure is carried out using infrared radiation having a wavelength of at least 750 nm to and including 1250 nm.

11. The method of claim 9 wherein the printing plate precursor is positive-working and the developing step removes the exposed regions.

12. The method of claim 9 wherein the polymeric binder in the printing plate precursor is represented by the following Structure (I), in random order:

  (I)

wherein A represents recurring units derived from one or more N-alkoxymethyl (alkyl)acrylamides or alkoxymethyl (alkyl)acrylates, B represents recurring units having pendant cyano groups, C represents recurring units having pendant 1H-tetrazole groups, and D represents one or more different recurring units other than those for A, B, and C, and w is at least 2 weight % to and including 80 weight %, x is at least 10 weight % to and including 85 weight %, y is at least 5 weight % to and including 80 weight %, and z is at least 10 weight % to and including 85 weight %, all based on total polymeric binder weight.

13. The method of claim 9 further comprising a step of baking the lithographic printing plate after step B.

14. The method of claim 13 wherein the baking step is carried out by exposure to UV, visible, or IR radiation, or by heating at from 160° C. to and including 220° C. for at least 30 seconds to and including 10 minutes, or by both the heating and UV, visible or IR exposure.

15. The method of claim 9 wherein a post-exposure preheat step is omitted.

16. The method of claim 9 wherein developing is carried out using a developer having a pH of at least 6 to and including 14.

17. The method of claim 9 wherein developing is carried out using a developer having a pH of at least 7 to and including 12.

18. The method of claim 9 wherein developing is carried out using a silicate-free developer having a pH of at least 11.

19. The method of claim 9 wherein developing is carried out using a silicate-free developer having a pH of at least 12 to and including 14.

* * * * *